United States Patent [19]
Klein et al.

[11] Patent Number: 5,951,307
[45] Date of Patent: Sep. 14, 1999

[54] METHOD FOR GROUNDING A PRINTED CIRCUIT BOARD USING A SEPARATE METALLIC CONTACTING ELEMENT PRESSED AGAINST A METALLIC CHASSIS

[75] Inventors: Dean A. Klein; Michael V. Leman, both of Eagle, Id.

[73] Assignee: Micron Electronics, Inc., Nampa, Id.

[21] Appl. No.: 08/985,792

[22] Filed: Dec. 5, 1997

[51] Int. Cl.[6] .................................................. H01R 4/66
[52] U.S. Cl. ............................................................ 439/92
[58] Field of Search .............................. 439/92; 361/174; 174/51

[56] References Cited

U.S. PATENT DOCUMENTS

| | | | |
|---|---|---|---|
| 5,164,916 | 11/1992 | Wu et al. | 365/52 |
| 5,647,748 | 7/1997 | Mills et al. | 439/81 |
| 5,691,504 | 11/1997 | Sands et al. | 174/35 |

*Primary Examiner*—Edgar Burr
*Assistant Examiner*—Charles H. Nolan, Jr.
*Attorney, Agent, or Firm*—Park & Vaughan

[57] ABSTRACT

One embodiment of the present invention provides a method for securing a printed circuit board to a chassis and electrically coupling the printed circuit board to a reference voltage, such as ground. This is accomplished without using screws, and without requiring contacts to be soldered to the printed circuit board. This embodiment includes a chassis, including conductive material at the reference voltage. A mount extends from the chassis and includes a fastener for fastening to the printed circuit board. This embodiment also includes a contact surface on the printed circuit board, for electrically coupling the printed circuit board to the chassis. Additionally, this embodiment includes a contacting element, including an electrically conductive material, which exerts a restoring force when deformed. This contacting element can be located so that it is compressed between the contact surface and the chassis when the printed circuit board is fastened to the mount. When compressed, the contacting element is deformed and exerts a restoring force against the contact surface and the chassis to form a conducting path between the contact surface and the chassis. In a variation on this embodiment, the contacting element includes an opening, through which the mount and fastener extend before the fastener is coupled to the printed circuit board.

17 Claims, 8 Drawing Sheets

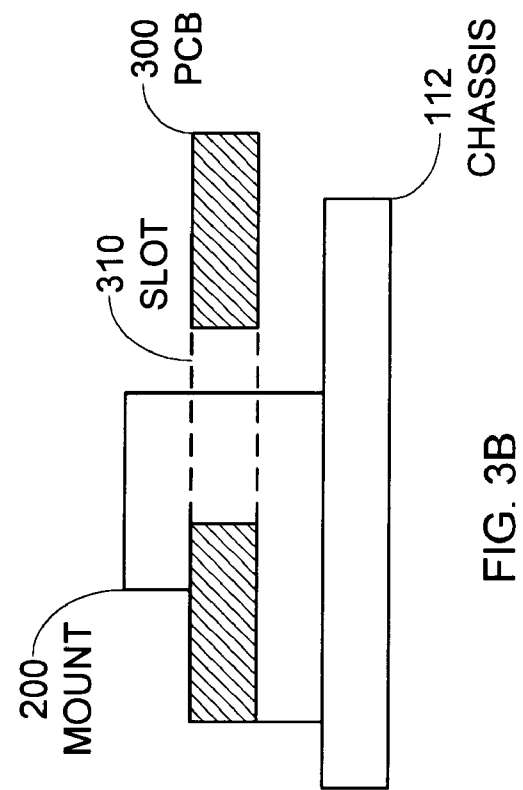
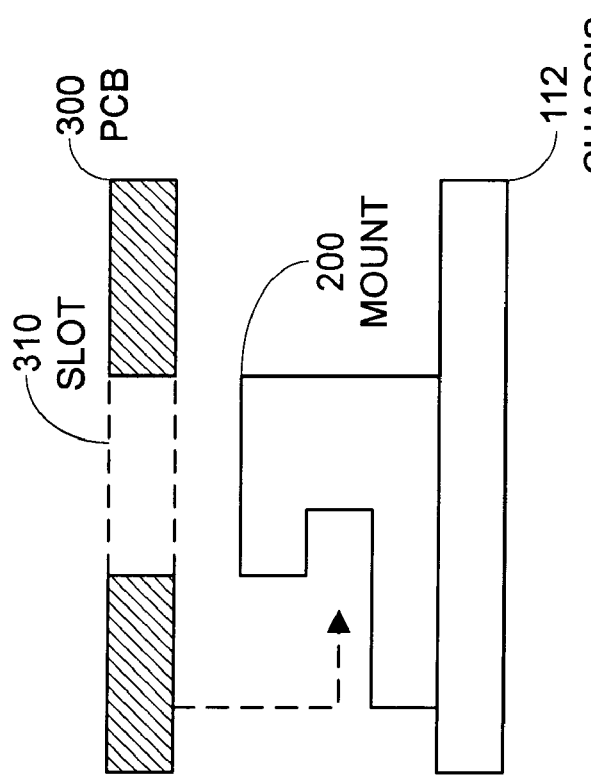
FIG. 3A (PRIOR ART)
FIG. 3B (PRIOR ART)

(SIDE-VIEW PRIOR ART)

(CROSS-SECTIONAL VIEW PRIOR ART)

METHOD FOR GROUNDING A PRINTED CIRCUIT BOARD USING A SEPARATE METALLIC CONTACTING ELEMENT PRESSED AGAINST A METALLIC CHASSIS

RELATED APPLICATION

This application hereby incorporates by reference the following related non-provisional application by the same inventors as the instant application, and filed on the same day as the instant application: "Apparatus for Grounding a Printed Circuit Board," having serial number TO BE DETERMINED, and filing date TO BE DETERMINED (Attorney Docket No. MEI-97-02914.00).

BACKGROUND

1. Field of the Invention

The present invention relates to making ground connections to printed circuit boards, and more particularly to a contacting element composed of an electrically conductive material which exerts a restoring force when deformed. This contacting element is compressed between a metal chassis and a printed circuit board to form a ground connection between the printed circuit board and the chassis.

2. Related Art

The business of manufacturing computer systems, and especially personal computer systems, has become very cost-competitive. Because most personal computers are built around identical microprocessors and memory chips, there is presently very little technological differentiation between personal computer systems produced by different manufacturers. Hence, competition between manufacturers is primarily focussed on price. This has driven profit margins down sharply, and has increased competition to assemble computer systems cheaply.

The cost of assembling a computer system can be reduced by simplifying or automating the assembly process. One manufacturing step that has so far been hard to automate is the process of connecting a printed circuit board, such as a motherboard, to a computer system chassis. This connection must typically be made so that the printed circuit board is reliably grounded to the computer system chassis. Referring to FIG. 1, motherboard 100 is mounted into chassis 112 of personal computer system 110 using a contacting element to make a ground connection between motherboard 100 and the chassis 112.

Computer manufacturers typically fasten a motherboard to a computer system chassis by screwing the motherboard to the chassis, so that the printed circuit board is grounded to the chassis by an electrical contact. This electrical contact can be made through a screw, or through contacting surfaces on the printed circuit board and the chassis, which are brought together when the printed circuit board is screwed to the chassis.

This process of screwing a motherboard to the chassis is very time-consuming. An assembly line worker must manually insert and screw down as many as six screws in order to fasten a motherboard to a computer system chassis. Unfortunately, the process of screwing the motherboard to the chassis requires fine motor control, and is consequently hard to automate.

Furthermore, the process of screwing a motherboard into a computer system chassis can potentially cause damage to the computer system. An assembly line worker may slip while operating a screwdriver, and the screwdriver or the screw may cause damage to the printed circuit board. The assembly line worker may also inadvertently drop a screw into the computer system, where the screw may be hard to locate, and may cause electrical shorting.

Some computer manufacturers have eliminated the step of screwing motherboard 100 to chassis 112 by instead sliding motherboard 100 into a mount 200 on a chassis 112. Referring the FIG. 2, mount 200 may be formed by cutting a tab from chassis 112, and bending the tab so that it extends away from chassis 112. Note that the mount 200 includes a slot for receiving motherboard 100.

Referring the FIGS. 3A and 3B, a printed circuit board 300 (such as motherboard 100) may be fastened to mount 200 by inserting mount 200 through an opening in printed circuit board 300, and sliding printed circuit board 300 so that it is secured to mount 200. See FIG. 3B. Not shown in FIGS. 3A and 3B is a locking mechanism coupled to chassis 112 that flips up when printed circuit board 300 is slid into place, in order to lock printed circuit board 300 in place.

Referring to FIGS. 4A and 4B, some manufacturers achieve a ground connection between printed circuit board 300 and chassis 112 by means of a pressure contact between fingers 400 and chassis 112. Fingers 400 include a conductive material, which exerts a restoring force when deformed or biased. Referring to FIG. 4B, fingers 400 are bonded to printed circuit board 300 with solder connections 412. When mount 200 is extended through slot 310 in printed circuit board 300, fingers 400, which would normally extend over slot 310, are displaced from their normal position so they exert a force against mount 200. This creates pressure contacts between fingers 400 and mount 200, which create a ground connection between printed circuit board 300 and chassis 112.

Although the above-mentioned method for securing printed circuit board 300 to chassis 112 does not use screws, it has other disadvantages. Fingers 400 must be soldered or otherwise connected onto printed circuit board 300. If this soldering is performed manually, the soldering process can be quite time-consuming and expensive. If the soldering is performed automatically, solder is likely to wick up from solder connection 412 onto the fingers 400. This may cause fingers 400 to be soldered to opposing fingers 410, if fingers 400 are not separated from opposing fingers 410 during soldering.

Furthermore, referring the FIG. 2, the method of forming mount 200 from chassis 112 leaves a hole in chassis 112. Electromagnetic interference from circuitry within chassis 112 can leak out of the chassis through this hole.

What is needed is an apparatus for grounding and securing a printed circuit board to a chassis of a computer system that is free from the disadvantages of using screws and the disadvantages of soldering contacts to a printed circuit board.

SUMMARY

One embodiment of the present invention provides a method for securing a printed circuit board to a chassis and electrically coupling the printed circuit board to a reference voltage, such as ground. This is accomplished without using screws, and without requiring contacts to be soldered to the printed circuit board. This embodiment includes a chassis, including conductive material at the reference voltage. A mount extends from the chassis and includes a fastener for fastening to the printed circuit board. This embodiment also includes a contact surface on the printed circuit board, for electrically coupling the printed circuit board to the chassis. Additionally, this embodiment includes a contacting element, including an electrically conductive material, which exerts a restoring force when deformed. This contacting element can be located so that it is compressed between the contact surface and the chassis when the printed circuit board is fastened to the mount. When compressed, the contacting element is deformed and exerts a restoring force against the contact surface and the chassis to form a conducting path between the contact surface and the chassis. In a variation on this embodiment, the contacting element includes an opening, through which the mount and fastener extend before the fastener is coupled to the printed circuit board.

In variation on this embodiment, the contacting element is not bonded to the printed circuit board and is not bonded to the chassis.

In another embodiment of the present invention, the mount includes a tab that is cut from a surface of the chassis. This tab is bent so that it extends away from the surface of the chassis to form the mount. In one embodiment, the contacting element covers the hole that is created in the chassis by forming the mount.

In yet another embodiment of the present invention, the fastener takes the form of a slot in the mount. The printed circuit board is slid into this slot to fasten the printed circuit board to the mount. In a variation on this embodiment, the printed circuit board includes a hole for extending the mount through before sliding the printed circuit board into the slot. In another variation on this embodiment, the apparatus includes a locking element coupled to the chassis for locking the printed circuit in place when the printed circuit board is slid into the slot in the mount.

In another embodiment of the present invention, the contacting element includes fingers extending from the contacting element, for forming an electrical connection with the contact surface on the printed circuit board.

In another embodiment of the present invention, the contacting element includes a locking mechanism, for locking the contacting element onto the chassis.

In another embodiment of the present invention, the apparatus comprises an entire computer system, including a chassis and a printed circuit board fastened to the chassis using a contacting element as described below.

Another embodiment of the present invention can be characterized as a contacting element for electrically coupling a printed circuit board to a reference voltage on a chassis. In this embodiment, the contacting element includes an electrical conductor, which exerts a restoring force when deformed. It also includes a plurality of fingers extending from the contacting element, for contacting a contact surface on the printed circuit board. The contacting element additionally includes an opening, for receiving a mount from the chassis.

Another embodiment of the present invention can be characterized as a method for coupling a printed circuit board to a chassis. The method includes placing a contacting element over a mount on the chassis, so that the mount extends through an opening in the contacting element. The method also includes compressing the contacting element between the printed circuit board and the chassis, so that the contacting element is deformed and exerts a restoring force against the printed circuit board and the chassis. The method additionally includes fastening the printed circuit board to a portion of the mount extending through the contacting element.

Another embodiment of the present invention can be characterized as a method for forming a contacting element for electrically coupling a printed circuit board to a chassis. The method includes forming the contacting element from an electrical conductor, which exerts a restoring force when deformed. The method also includes forming a plurality of fingers extending from the contacting element, for contacting a contact surface on the printed circuit board. The method additionally includes forming an opening in the contacting element, for receiving a mount from the chassis, in order to secure the contacting element to the chassis.

DESCRIPTION OF THE FIGURES

FIG. 3 illustrates how printed circuit board 300 slides into mount 200 on chassis 112 in accordance with an embodiment of the present invention.

DETAILED DESCRIPTION OF THE INVENTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
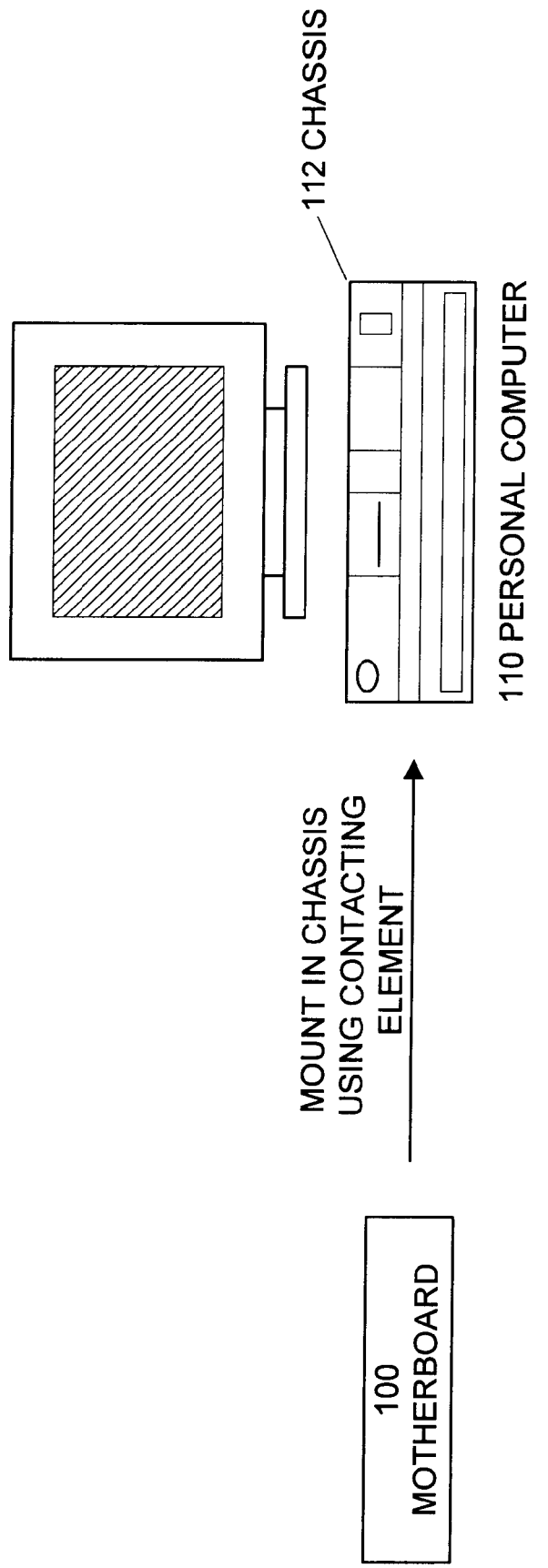
FIG. 1 illustrates how motherboard 100 fits into chassis 112 in computer system 110 in accordance with an embodiment of the present invention.

FIG. 1 illustrates an embodiment of the present invention in which motherboard 100 fits into chassis 112 in computer system 110 through use of a contacting element in accordance with an embodiment of the present invention. Although FIG. 1 illustrates a motherboard fitting into a computer system, the present invention is applicable to mounting any type of electrical component in any type of chassis wherein a ground connection is formed between the electrical component and the chassis. Such electrical components include, but are not limited to, printed circuit boards, wire wrap prototype boards and computer system motherboards. In the illustrated embodiment, chassis 112 is part of personal computer system 110. However, in general, the invention is applicable to any type of chassis that houses electrical circuitry. This includes, but is not limited to, a chassis for a television, a chassis for a stereo system component, a chassis for a video cassette recorder, a chassis for a portable electronic device and a chassis for a computer system.

Figure 2:
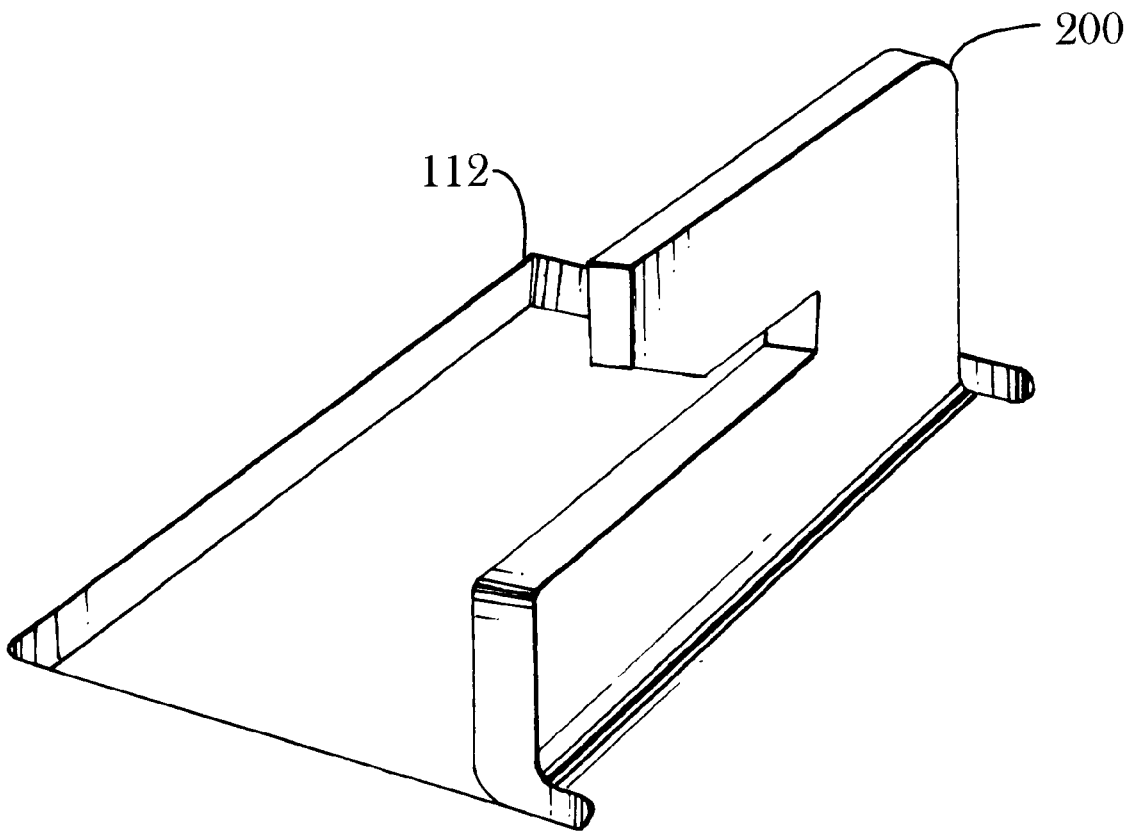
FIG. 2 illustrates how mount 200 for a printed circuit board can be formed from chassis 112 in accordance with an embodiment of the present invention.

FIG. 2 illustrates how mount 200 for a printed circuit board can be formed from chassis 112 in accordance with an embodiment of the present invention. In the illustrated embodiment, mount 200 may be formed by cutting a tab from chassis 112, and bending the tab so that extends away from chassis 112 to form mount 200. Note that the mount 200 includes a slot for receiving a printed circuit board. Although the mount illustrated in FIG. 2 is very simple and cost-effective to produce, the present invention is applicable to any type of mount 200 extending from chassis 112. This includes, but is not limited to, any type of mount that is welded soldered or otherwise affixed to chassis 112. It additionally includes any type of mount that is formed as part of chassis 112, during a molding process for example, or formed from chassis 112.

FIG. 3 illustrates how printed circuit board 300 slides into mount 200 on chassis 112 in accordance with an embodiment of the present invention. Although this is an effective means for fastening printed circuit board 300 to mount 200, the present invention is applicable to any known means of fastening printed circuit board 300 to mount 200. This includes, but is not limited to, fastening printed circuit board 300 to chassis 112 by using screws, by using clips, by gluing or by welding.

Figure 4A:
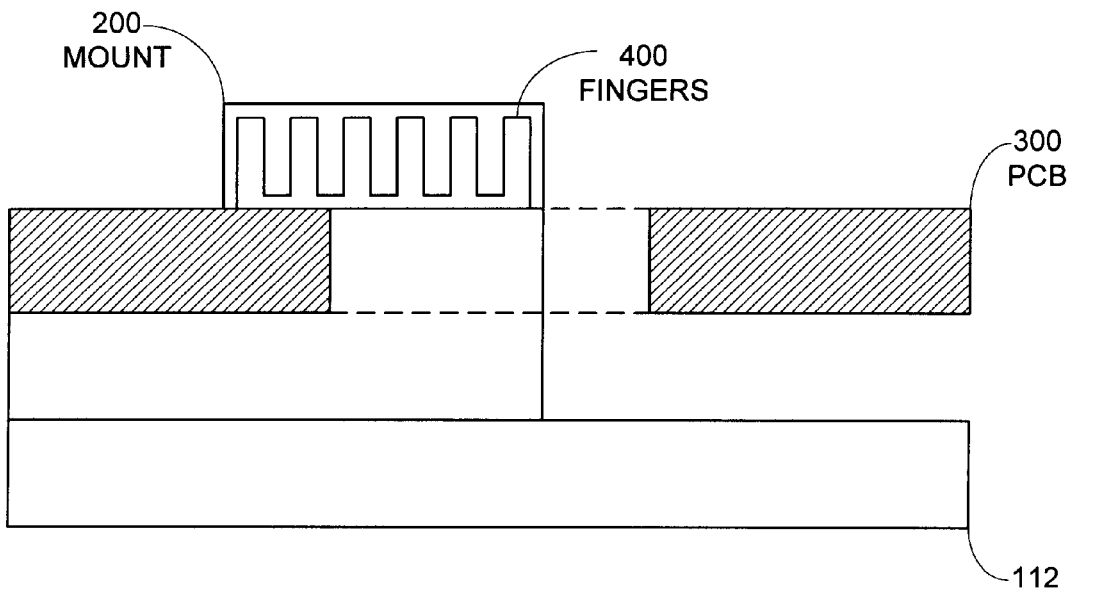
FIGS. 4A and 4B illustrate how fingers 400 make an electrical connection between mount 200 and printed circuit board 300 in accordance with a prior art invention.
Figure 4B:
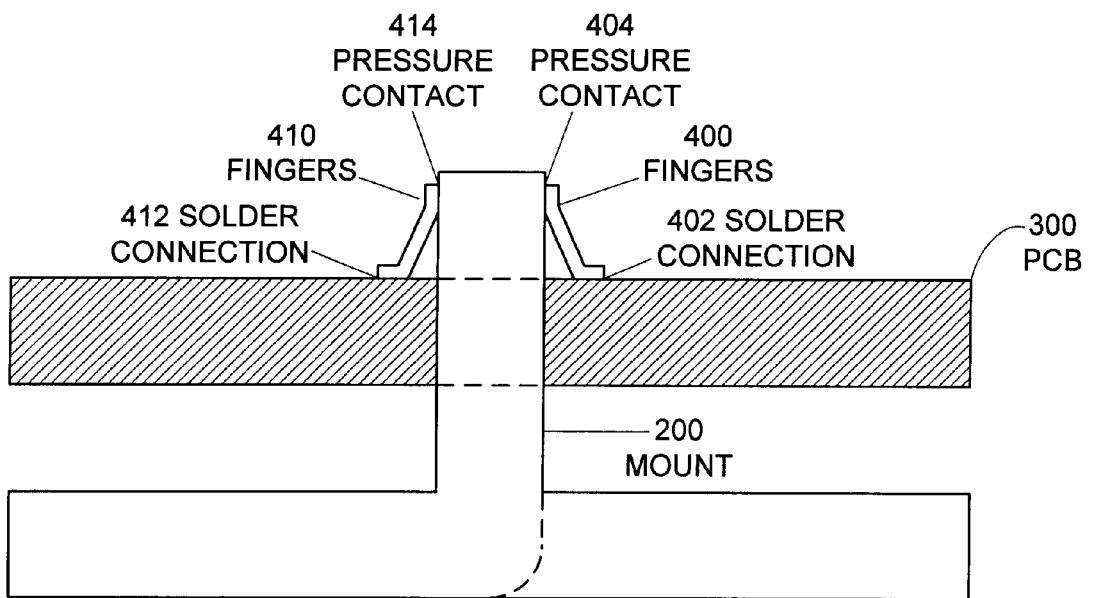

As described above, FIGS. 4A and 4B illustrate how fingers 400 make a grounding connection between mount 200 and printed circuit board 300 in accordance with a prior art invention.

Figure 5A:
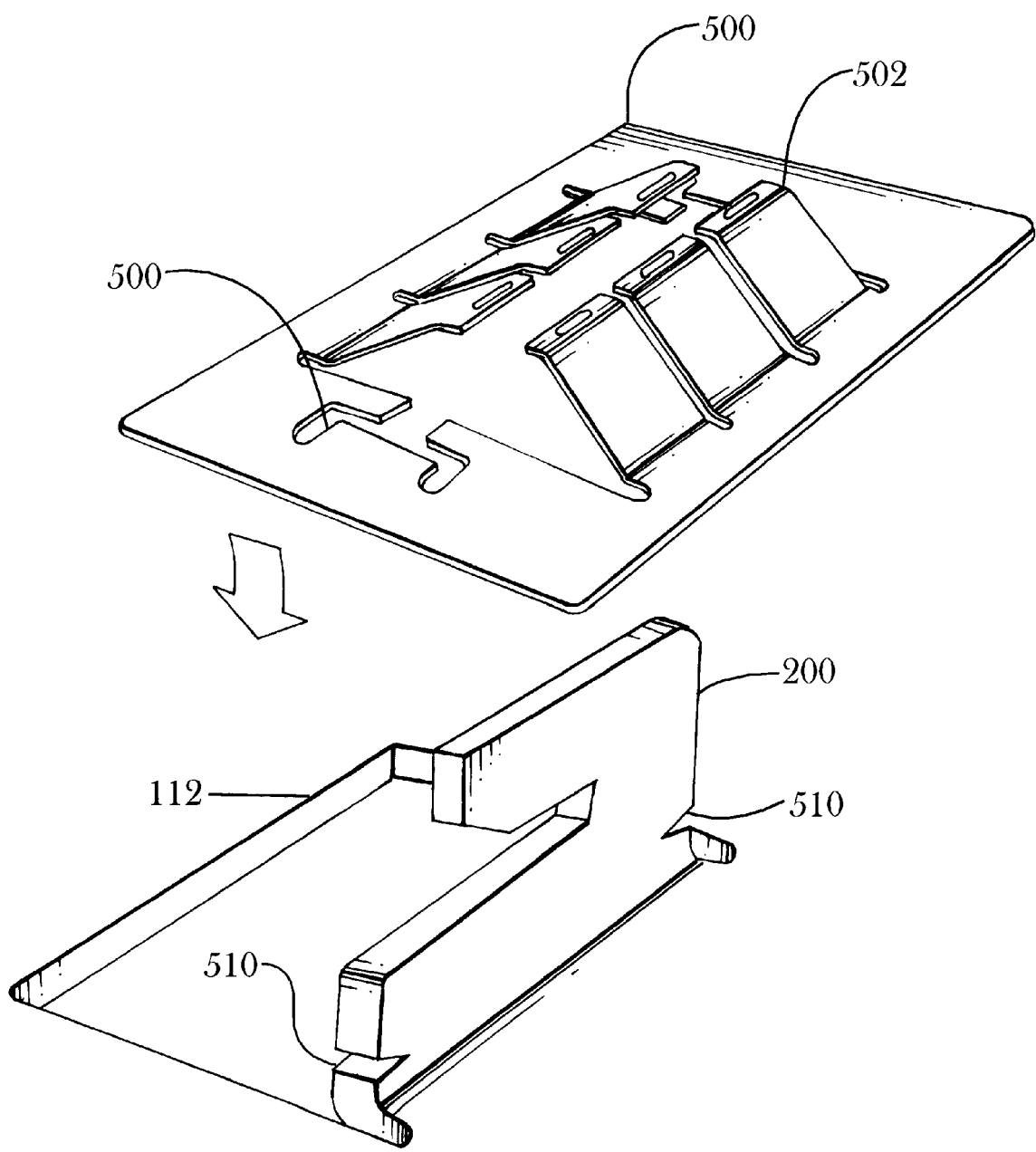
FIGS. 5A, 5B and 5C illustrate how contacting element 500 fits over mount 200 to establish a grounding connection between chassis 112 and printed circuit board 300 in accordance with an embodiment of the present invention.
Figure 5B:
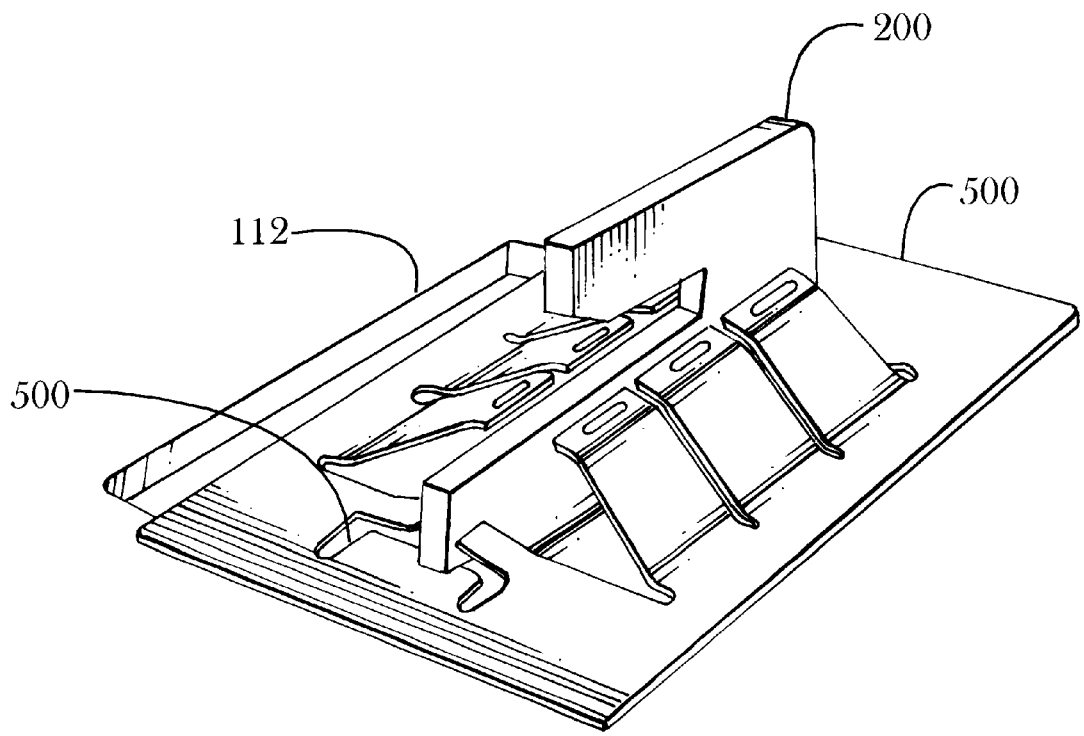
Figure 5C:
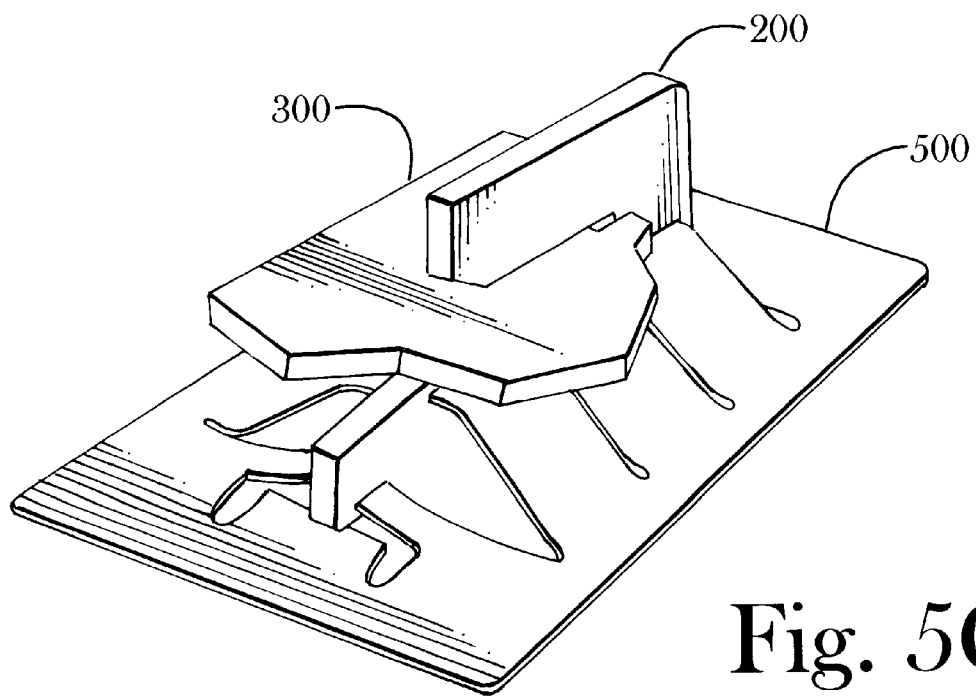

FIGS. 5A, 5B and 5C illustrate how contacting element 500 fits over mount 200 to establish a grounding connection between chassis 112 and printed circuit board 300 in accordance with an embodiment of the present invention. Referring to the embodiment illustrated in FIG. 5A, contacting element 500 is composed of a conductive material, which exerts a restoring force when deformed. In one embodiment, contacting element 500 includes a beryllium copper alloy. In another embodiment, contacting element 500 is not in the form of a single piece of metal, but rather includes multiple pieces, some of which are conductive, and some of which exert a restoring force.

In the illustrated embodiment, contacting element 500 includes fingers 502, which extend from contacting element 500 to make an electrical connection with printed circuit board 300. As illustrated, contacting element 500 may include member 505, which is part of a locking mechanism. When contacting element 500 is placed over mount 200, member 505 engages with notches 510 in mount 200, thereby locking contacting element 500 to mount 200.

Referring the embodiment illustrated in FIG. 5A, contacting element 500 is placed over mount 200 so that member 505 engages with notches 510 to lock contacting element to mount 200. Additionally, contacting element 500 substantially covers the hole in chassis 112 created while forming mount 200. This helps reduce the amount of electromagnetic interference passing through the hole in chassis 112. In another embodiment, contacting element 500 completely covers the hole.

Referring to the embodiment illustrated in FIG. 5C, after contacting element 500 is placed over mount 200, printed circuit board 300 is fastened to mount 200 by sliding printed circuit board 300 into the slot in mount 200. Sliding printed circuit board 300 into mount 200 compresses contacting element 500 between chassis 112 and printed circuit board 300. This biases contacting element 500 so that fingers 502 press against contact surface 700 on the underside of printed circuit board 300. At the same time, the underside of contacting element 500 presses against the surface of chassis 112. Thus, contacting element 500 may form an electrical connection between printed circuit board 300 and chassis 112.

Not shown in FIG. 5C is a locking mechanism coupled to chassis 112 that locks printed circuit board 300 in place when printed circuit board is slid into mount 200. In one embodiment, this locking mechanism includes a biased member that flips up to lock printed circuit board 300 in place, when printed circuit board 300 is slid into mount 200.

FIGS. 5A, 5B and 5C illustrate a single mount and a single contacting element for securing printed circuit board 300 to chassis 112. In another embodiment, printed circuit board 300 is secured to chassis 112 using a plurality of mounts, such as mount 200, and using a corresponding plurality of contacting elements, such as contacting element 500.

Figure 6:
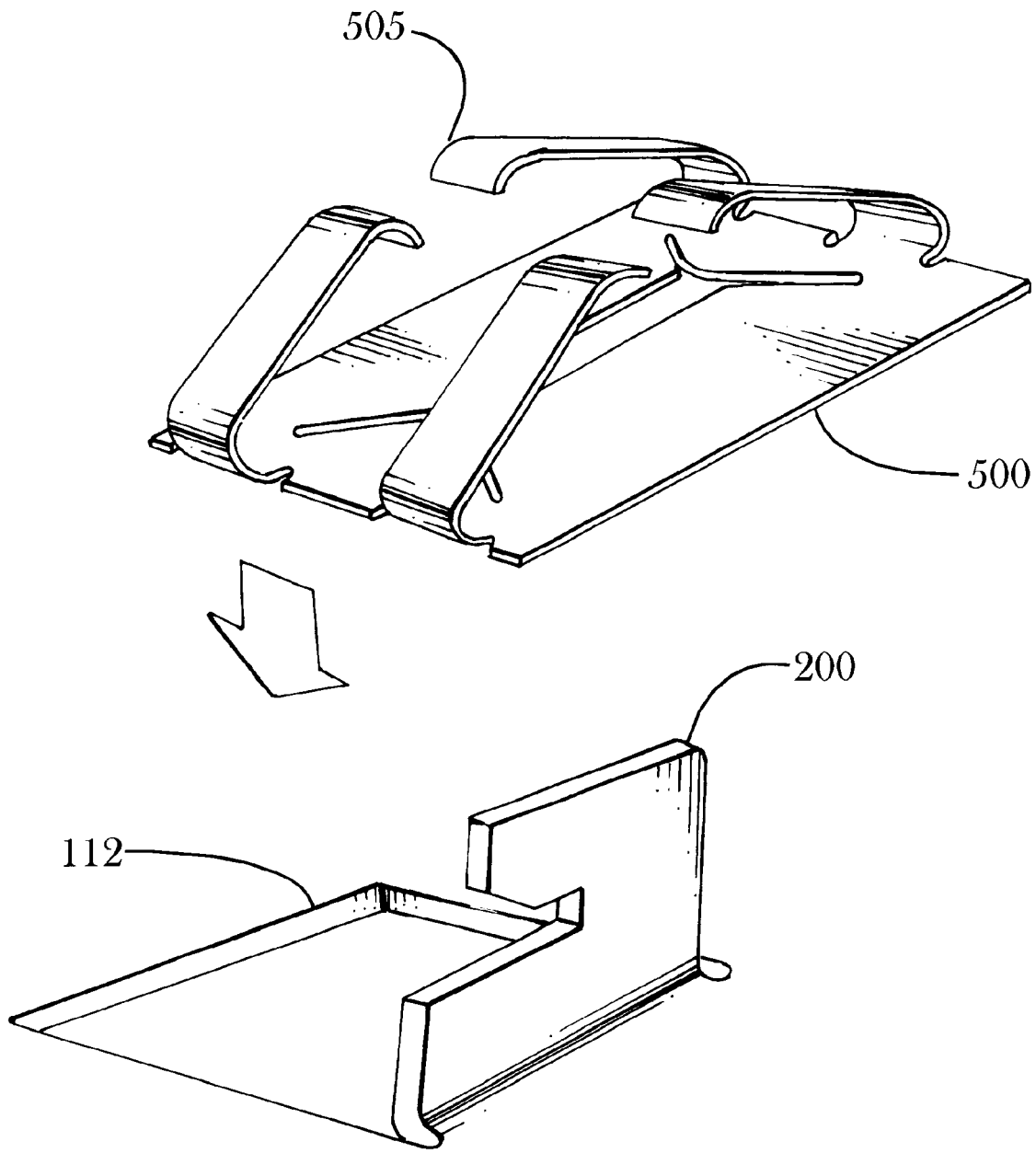
FIG. 6 illustrates an alternative embodiment of a contacting element 500 in accordance with an embodiment of the present invention.

FIG. 6 illustrates an alternative embodiment of contacting element 500 in accordance with an embodiment of the present invention. In this embodiment, a body portion of contacting element 500 is flat, and fingers 502 are formed by bending over extensions from contacting element 500 so that they extend above the body of contacting element 500. As in the embodiment of FIGS. 5A, 5B and 5C, fingers 502 press against the underside of printed circuit board 300 to form an electrical connection between printed circuit board 300 and chassis 112.

Figure 7:
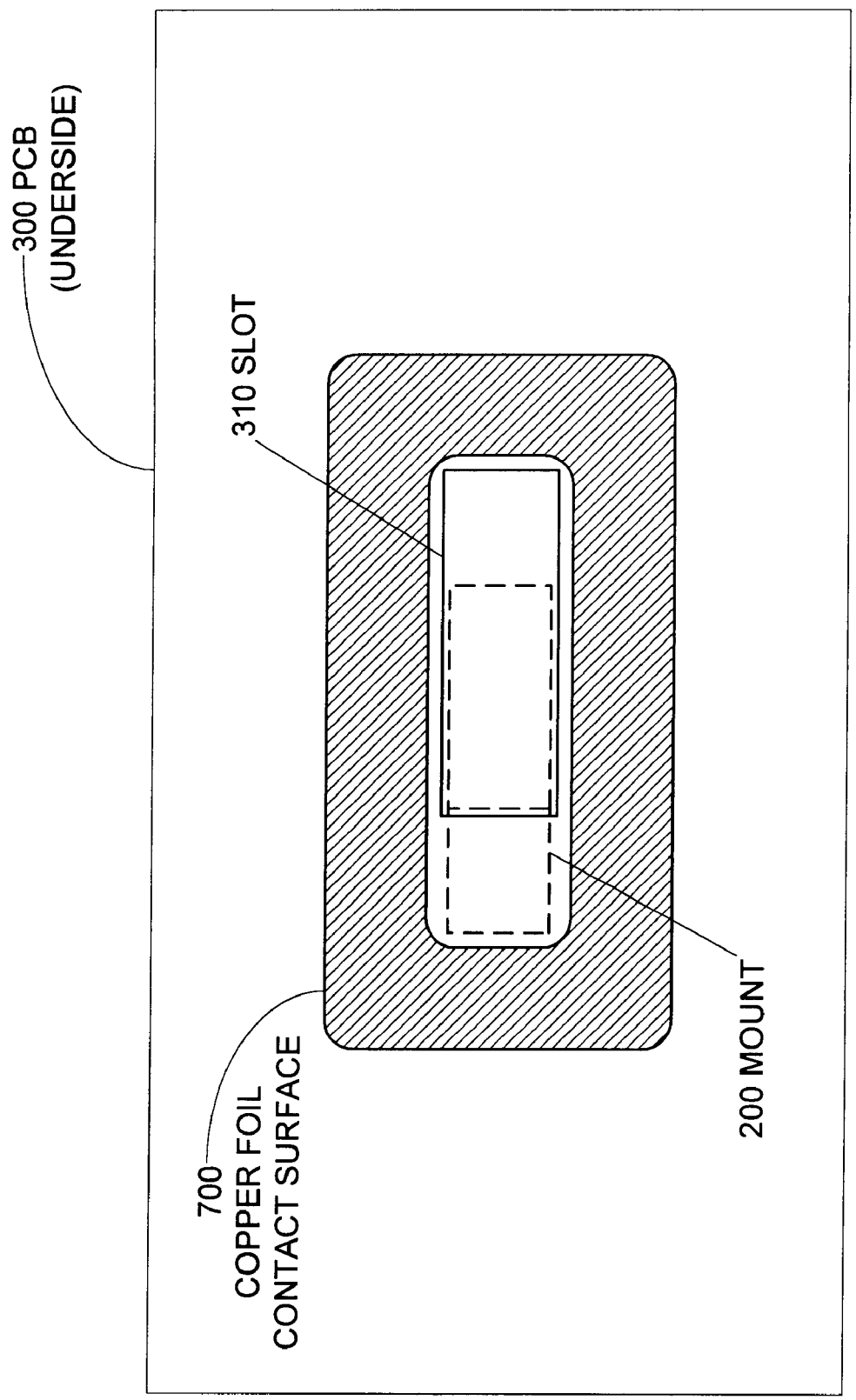
FIG. 7 illustrates contact surface 700 on the underside of printed circuit board 300, for connecting printed circuit board 300 to contacting element 500 in accordance with an embodiment of the present invention.

FIG. 7 illustrates contact surface 700 on the underside of printed circuit board 300, for forming an electrical connection with contacting element 500 in accordance with an embodiment of the present invention. In this embodiment, a region surrounding slot 310 in printed circuit board 300 is covered with a copper foil contact surface 700. Contact surface 700 presses against fingers 502 to form an electrical connection.

Definitions bonded—two elements are bonded together if the elements are fused or otherwise fixedly attached through molecular bonding, such as by soldering or gluing, and are not merely held together by pressure contact.

fingers—projections from the body of an element.

ground voltage—a reference voltage from which voltage differences are measured.

grounding—electrically coupling to a reference voltage.

motherboard—a printed circuit board that ties together the main elements of a computer system, typically including a mount for a processor and connections to peripheral devices.

The foregoing descriptions of embodiments of the invention have been presented for purposes of illustration and description only. They are not intended to be exhaustive or to limit the invention to the forms disclosed. Obviously, many modifications and variations will be apparent to practitioners skilled in the art.

What is claimed is:

1. A method for coupling a printed circuit board to a chassis, comprising:

provide a contacting element having a metallic base with a plurality of rectangular fingers having an upwardly slope from the metallic base to a lower edge of a mount on the chassis;

placing the contacting element over the mount, so that the mount extends through an opening in the contacting element;

next, locking the contacting element to the mount by engaging a locking mechanism on the contacting element with the mount;

after the contacting element is locked to the mount, placing the printed circuit board over the mount causing the contacting element to be compressed between the printed circuit board and the chassis, so that the contacting element is deformed and exerts a restoring force against the printed circuit board and the chassis; and fastening the printed circuit board to a portion of the mount extending through the contacting element.

2. The method of claim 1, including forming the mount on the chassis by cutting a tab from a surface of the chassis and bending the tab so that it extends away from the chassis.

3. The method of claim 2, wherein placing the contacting element over the mount includes using the contacting element to at least partially cover the hole in the chassis that is created when the mount is cut from the chassis and bent away from the chassis.

4. The method of claim 1, including extending the mount through a hole in the printed circuit board before placing the contacting element over the mount.

5. The method of claim 1, wherein fastening the printed circuit board includes sliding the printed circuit board into a slot in the mount.

6. The method of claim 5, including locking the printed circuit in place using a locking element coupled to the chassis after the printed circuit board is slid into the slot in the mount.

7. The method of claim 1, wherein fastening the printed circuit board to a portion of the mount includes fastening a motherboard to a portion of the mount.

8. The method of claim 1, wherein compressing the contacting element between the printed circuit board and the chassis includes compressing the contacting element against a copper foil contact surface on the printed circuit board.

9. The apparatus of claim 1, wherein compressing the contacting element includes compressing a beryllium copper alloy contacting element.

10. The apparatus of claim 1, wherein compressing the contacting element includes compressing fingers extending from the contacting element against a contact surface on the printed circuit board.

11. A method for coupling a motherboard to a chassis, comprising:

forming a mount from the chassis by cutting a tab from a surface of the chassis and bending the tab so that it extends away from the chassis;

extending the mount through a hole in the motherboard;

placing a contacting element over the mount, so that the mount extends through an opening in the contacting element, and so that the contacting element to at least partially covers the hole in the chassis created when the mount is cut from the chassis and bent away from the chassis;

wherein the contacting element has a metallic base with a plurality of rectangular fingers having an upwardly slope from the metallic base to a lower edge of the mount;

next, locking the contacting element to the mount by engaging a locking mechanism on the contacting element with the mount;

after the contacting element is locked to the mount, placing the motherboard over the mount causing the contacting element to be compressed between the motherboard and the chassis, so that the contacting element is deformed and exerts a restoring force against the motherboard and the chassis; and fastening the motherboard to a portion of the mount extending through the contacting element.

12. The method of claim 11, wherein fastening the motherboard includes sliding the motherboard into a slot on the mount.

13. The method of claim 11, including locking the motherboard in place using a locking element coupled to the chassis after the motherboard is slid into the slot in the mount.

14. The method of claim 11, wherein compressing the contacting element between the mother board and the chassis includes compressing the contacting element against a copper foil contact surface on the motherboard.

15. The apparatus of claim 11, wherein compressing the contacting element includes compressing a beryllium copper alloy contacting element.

16. The apparatus of claim 12, wherein compressing the contacting element includes compressing fingers extending from the contacting element against a contact surface on the printed circuit board.

17. A method for forming a contacting element for electrically coupling a printed circuit board to a chassis, comprising:

forming the contacting element from an electric conductor which exerts a restoring force when deformed;

forming a metallic base for the contacting element;

forming a plurality of rectangular fingers extending from the contacting element, for contacting a contact surface on the printed circuit board;

a contacting element having a metallic base with a plurality of rectangular fingers having an upwardly slope from said base to a lower edge of a mount on the chassis;

forming an opening in the contacting element, for receiving a mount from the chassis, in order to secure the contacting element to the chassis;

wherein when the contacting element is secured to the chassis, the plurality of rectangular finger have an upwardly slope from the metallic base to a lower edge of the mount; and forming a locking mechanism in the contacting element, the locking mechanism being configured to lock the contacting element onto the chassis before the printed circuit board is brought into contact with the contacting element.

* * * * *

UNITED STATES PATENT AND TRADEMARK OFFICE
CERTIFICATE OF CORRECTION

PATENT NO : 5,951,307
DATED : September 14, 1999
INVENTOR(S): Klein, et al.

It is certified that an error appears in the above-identified patent and that said Letters Patent is hereby corrected as shown below:

In claim 16 (at column 8, line 26), please replace "12" with --11--.

Signed and Sealed this

Eighteenth Day of April, 2000

Attest:

Q. TODD DICKINSON

*Attesting Officer*                *Director of Patents and Trademarks*